United States Patent [19]

Miura et al.

[11] 4,264,715
[45] Apr. 28, 1981

[54] METHOD OF PREPARING RESIST PATTERN

[75] Inventors: Akira Miura, Toride; Shozo Hideyama, Yokohama; Iwao Higashikawa, Tokyo, all of Japan

[73] Assignee: VLSI Technology Research Association, Japan

[21] Appl. No.: 94,048

[22] Filed: Nov. 14, 1979

[30] Foreign Application Priority Data

Nov. 17, 1978 [JP] Japan ................................ 53/141790

[51] Int. Cl.³ .............................................. G03C 5/00
[52] U.S. Cl. ................................. 430/326; 427/271; 430/296
[58] Field of Search ............... 430/296, 326; 427/271, 427/272, 273

[56] References Cited

U.S. PATENT DOCUMENTS

| 3,984,582 | 10/1976 | Feder et al. | 427/43 |
| 3,987,215 | 10/1976 | Cortellino | 430/326 |
| 4,004,043 | 1/1977 | Hiraoka | 427/273 |
| 4,051,271 | 9/1977 | Fujishige | 430/296 |

Primary Examiner—Jack P. Brammer
Attorney, Agent, or Firm—Finnegan, Henderson, Farabow, Garrett & Dunner

[57] ABSTRACT

A method of preparing a fine and highly precise resist pattern comprising a step of forming a positive resist layer consisting of poly-(methacrylic anhydride) on a substrate, a step of irradiating the resist layer thus formed with a predetermined pattern of ionizing radiation and a step of developing the irradiated resist pattern with a developer comprising a solvent mixture composed of a polar organic solvent (A) capable of dissolving poly-(methyacrylic anhydride) and a nonsolvent (B) incapable of dissolving poly-(methacrylic anhydride).

7 Claims, 1 Drawing Figure

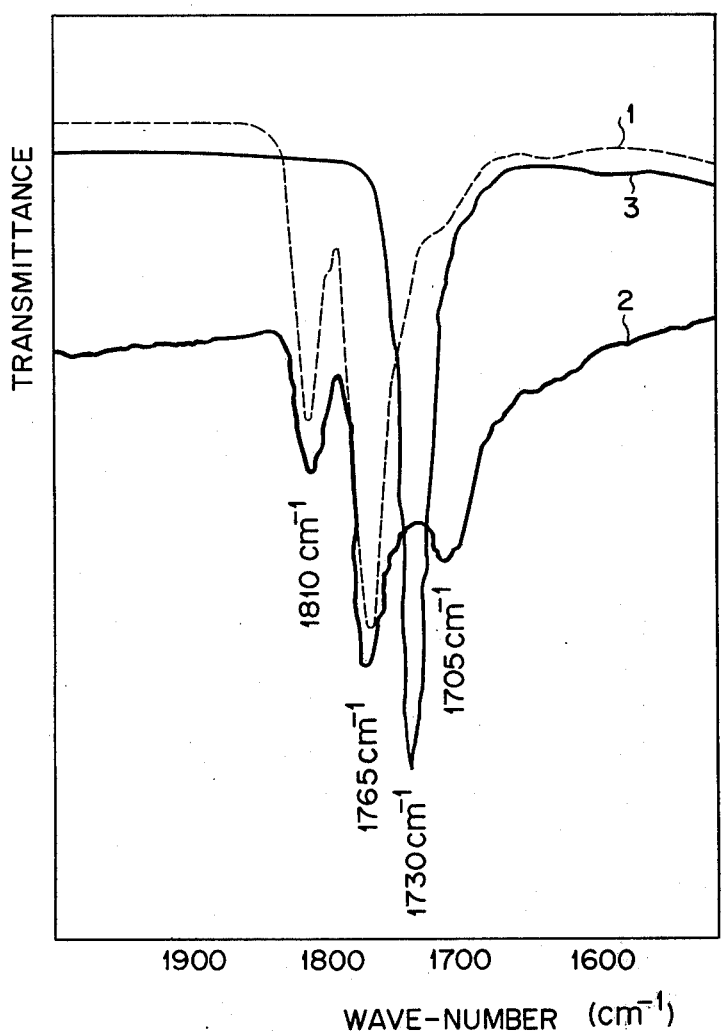

METHOD OF PREPARING RESIST PATTERN

This invention relates to methods of preparing resist patterns and, more particularly, to a method of preparing resist patterns by using an improved resist layer and a developer therefor.

BACKGROUND OF THE INVENTION

Usually, the methods of preparing resist patterns in the manufacture of semiconductor integrated circuits make use of photolithography, and with rise of the demand for increased density and degree of integration of semi-conductor integrated circuits in recent years lithography using ionizing radiation such as electron beams and X-ray has been attracting attention as the resist pattern preparation method capable of meeting the above demand. As the resist material used for the lithography adopting such ionizing radiation, positive resist materials capable of being degraded into lower molecular weight compounds by irradiation with ionizing radiation, for instance polymethyl methacrylate and polybutene-1-sulfon, are well known in the art. However, such resist materials are inadequate as the resist material for use in the preparation of resist patterns because they have intrinsic drawbacks. That is, polybutene-1-sulfon, although its sensitivity is high, more than ten times that of polymethyl methacrylate, is inferior in resolution to polymethyl mechacrylate. Besides, its adhesion to semiconductor substrates is inferior. Further, it is easily thermally decomposed and thus inferior in resistance to dry etching, and thus it is not compatible with the dry etching process, which is indispensable for high density fabrication. Polymethyl methacrylate is superior in resolution, but its sensitivity is insufficient (for instance, on the order of one-tenth to one-thousandth of the sensitivity of a negative resist crosslinked by irradiation with ionizing radiation). Therefore, for selectively making the irradiated portion soluble it is necessary to increase the exposed dose or extend the period of irradiation, which is disadvantageous from the standpoints of utility and productivity.

For improving the sensitivity of polymethyl methacrylate there have been such attempts as polymerization to high molecular weight, copolymerization with radiation-sensitive materials, and substitution of other degradable ester groups for the methyl ester group. However, the resists with higher molecular weight have inferior coating properties, so that in this case it is difficult to coat a resist layer of a uniform thickness on a substrate. Those which are obtained by copolymerizing polymethyl mechacrylate with radiation-sensitive materials and also those which are obtained by substituting other degradable ester groups for the methyl ester group of polymethyl methacrylate are inferior in thermal senstivity to polymethyl methacrylate and are therefore low in resolution and can not be compatible with the dry etching process.

SUMMARY OF THE INVENTION

An object of the invention is to provide a method of preparing fine and highly precise resist patterns having an excellent etching-resistivity.

The invention features a method of preparing a resist pattern comprising a step of forming a positive resist layer consisting of poly-(methacrylic anhydride), a step of irradiating the resist layer with ionizing radiation of a predetermined pattern and a step of developing the resultant resist layer with a developer comprising a solvent mixture composed of a polar organic solvent (A) capable of dissolving poly-(methacrylic anhydride) and an organic non-solvent (B) incapable of dissolving poly-(methacrylic anhydride).

This invention can be more fully understood from the following detailed description when taken in conjunction with the accompanying drawing.

BRIEF DESCRIPTION OF THE DRAWING

The FIGURE shows infrared absorption spectra for a positive resist layer obtained in an embodiment of the invention and positive resist layers obtained by prior-art methods.

DESCRIPTION OF THE PREFERRED EMBODIMENTS

The invention provides a method of preparing resist patterns featuring the use of a combination of a poly-(methacrylic anhydride), free from the unreacted components and the intermediate, and a developer comprising a solvent mixture composed of a polar solvent (A) capable of dissolving the aforesaid resist material and a non-solvent (B) incapable of dissolving the resist material.

In the preparation of the positive resist material consisting of poly-(methacrylic anhydride), polymethacrylic acid or polymethacrylate such as a polyalkyl methacrylate having an alkyl group with a carbon atom number of 4 or above, for instance poly-t-butyl methacrylate or poly-n-pentyl methacrylate, is used as a starting material.

The side chain reactions are predominent in these starting materials, so that they can be readily converted into poly-(methacrylic anhydride) by heating.

The positive resist layer consisting of poly-(methacrylic anhydride) may be formed on a substrate by using the aforementioned starting material in either one of two methods, namely:

(1) A method of forming a positive resist layer consisting of poly-(methacrylic anhydride) by dissolving the starting material in a suitable polar solvent, for instance methylisobutylketone, coating the resultant solution on the subtrate by means of spin coating and then thermally treating the coating to cause decomposition of the side chain of the starting material, namely hydroxyl group and alkyl group; and (2) A method of forming a positive resist material consisting of poly-(methacrylic anhydride) by first thermally treating the starting material in the initial powdery state at 200° to 250° C. for conversion into poly-(methacrylic anhydride), then dissolving this polymer in a polar solvent which is at least one member of a group consisting of dimethylformamide, dimethylacetoamide, N-methyl-2-pyrrolidone and dimethyl sulfoxide and coating the resultant solution on the substrate by means of spin coating.

In the above methods (1) and (2) the heating temperature is limited to be between 200° and 250° C. from the grounds that with heating to a temperature below 200° C. the resultant resist layer contains the unreacted components and the intermediate so that its solvent-resistivity is insufficient. Thus, in this case, it is impossible to ensure steady development. Also, the thickness of the non-irradiated portion of the layer is likely to be reduced, and it is impossible to prepare patterns with high reproducibility. In case of heating to a temperature in excess of 250° C., decomposition and deterioration of the resist layer is liable.

The FIGURE shows infrared spectra obtained by the heat-treatment of polybutyl methacrylate used as starting material by the above method (1) or (2) and resist layers prepared from the same starting material but by other methods than the method (1) or (2). In the FIGURE, curve 1 corresponds to a spectrum of a resist layer prepared by the method (1) or (2), curve 2 is a spectrum of a resist layer prepared by ordinary prebaking of polybutyl methacrylate curve 200° C. after coating, and at 3 is a spectrum of a resist layer prepared by merely drying polybutyl methacrylate after coating. The four large absorption peaks are assigned to carbonyls attached to hydroxyl group, ester group and acid anhydride group in order from the lower wave-number side. As is seen from the FIGURE, the resist layer prepared by the method (1) or (2) (curve 1), unlike the resist layers prepared by other methods than the method (1) and (2) (curves 2 and 3), does not contain the unreacted component such as ester group and the intermediate component such as hydroxy group.

The solubility of these three different resist layers was examined by experiments, and it was found that the resist layer of curve 3 readily dissolved in methylisobutylketone, toluene and Cellosolve (a trade name) and the resist layer of curve 2 poorly withstood the above solvents. In contrast, the resist layer of curve 1 was soluble to limited solvents such as dimethylformamide, dimethylacetoamide, N-methyl-2-pyrrolidone and dimethylsulfoxide and insoluble to methylisobutylketone, toluene and Cellosolve (a trade name). Also, it showed very satisfactory solvent resistance against a solvent mixture consisting of dimethylformamide, a polar solvent capable of dissolving it, and methylisobutylketone, a non-solvent incapable of dissolving it.

As ionizing radiation used in the method according to the invention there are $\gamma$-rays and $\alpha$-rays as well as electron beam and X-rays.

In accordance with the invention, the pattern of ionizing radiation may be formed by a direct patterning method, in which the resist layer is scanned with a controlled electron beam, and an indirect patterning method, in which the resist pattern is irradiated with ionizing radiation via a mask having a desired pattern.

The developer used in the method according to the invention is a solvent mixture consisting of a polar solvent (A) capable of dissolving the resist material and a non-solvent (B) incapable of dissolving it. Examples of the polar solvents (A) capable of dissolving the resist material are dimethylformamide, dimethylacetoamide, N-methylpyrrolidone and dimethylsulfoxide. Examples of the non-solvent (B) are aromatic series organic solvents such as benzene, toluene and chlorobenzene, ketone series organic solvents such as methylisobutylketone and methylethylketone and organic solvents such as ethyl acetate, isoamyl acetate, butyl cellosolve (a trade name), ethyl cellosolve (a trade name), butyl cellosolve acetate (a trade name) and ethyl cellosolve acetate (a trade name).

The ratio between the solvent (A) and non-solvent (B) in the solvent mixture necessary for dissolving the resist material depends upon the irradiation dose of the ionizing radiation and preferably ranges between 80/20 and 20/80.

Now, examples of the invention are given.

EXAMPLES 1 to 7

Poly-t-butyl methacrylate was dissolved in methylisobutylketone, and the resultant solution was coated by spin coating on a silicon substrate and then thermally treated at 210° C. for 90 minutes to form a positive resist layer consisting of poly-(methacrylic anhydride) and having a thickness of 0.7 $\mu$m on the substrate. Then, patterns consisting of lines 1 $\mu$m wide and spaced apart by 1 $\mu$m were drawn on desired portions of the resist layer with an electron beam with an accelerating voltage of 20 kV and developed by using solvent mixtures of compositions listed in the Table below.

TABLE

| | Developer | Electron beam sensitivity ($\mu$c/cm$^2$) |
|---|---|---|
| Example 1 | Dimethylformamide/chlorobenzene, 4/6 | 11 |
| Example 2 | Dimethylformamide/chlorobenzene, 7/3 | 1.3 |
| Example 3 | Dimethylformamide/ethyl cellosolve acetate, 4/6 | 4 |
| Example 4 | Dimethylformamide/ethyl cellosolve acetate, 5/5 | 3.3 |
| Example 5 | Dimethylformamide/butyl cellosolve acetate, 5/5 | 4.5 |
| Example 6 | Dimethylformamide/butyl cellosolve acetate, 6/4 | 1 |
| Example 7 | N-methylpyrrolidone/chlorobenzene, 4/6 | 15 |
| Control 1 | Methylisobutylketone | 40 to 60 |

The irradiation dose (sensitivity) required for completely removing the resist layer portions irradiated by the electron beam in Examples 1 to 7 was measured, and the results are shown in the same table. In control 1, the resist layer was prepared by using a methoxyethyl acetate solution of polymethyl methacrylate, and the sensitivity was obtained by using methylisobutylketone as a developer.

It will be seen from the above Table that the sensitivities obtained with the methods of Examples 1 to 7 are about 3 to 60 times higher compared to the case of Control 1. Further, it was confirmed that according to Examples 1 to 7 1-$\mu$m-wide line patterns could be precisely resolved.

EXAMPLE 8

Poly-n-butylmethacrylate was dissolved in methylisobutylketone, and the resultant solution was coated by spin coating on a chromium-masked substrate and then thermally treated at 220° C. for 60 minutes to form a positive resist layer consisting of poly-(methacrylic anhydride) and having a thickness of 0.8 $\mu$m. Then, 0.5-$\mu$m wide lines were drawn on this resist layer with an electron beam with an accelerating voltage of 20 kV and an irradiation dose of 1.5 $\mu$c/cm$^2$, followed by development with a dimethylformamide-chlorobenzene solvent mixture (with a mixture ratio of 7:3), and a 0.5-$\mu$m -wide line pattern could be precisely obtained.

CONTROL 2

Poly-n-butylmethacrylate was dissolved in methylisobutylketone, and the resultant solution was coated by spin coating on a chromium-masked substrate and then dried to form a positive resist layer consisting of poly-n-butylmethacrylate and having a thickness of 0.8 $\mu$m. Then, patterns were drawn under the same conditions as in Example 8 and developed with a methylisobutylketone-chlorobenzene solvent mixture. The obtained pattern was inferior in precision and locally had lines of different widths.

The resist patterns prepared in Example 8 and Control 2 were subjected to post-baking at 180° C. for 30 minutes and then used as a mask for spatter etching exposed chromium layer portions with carbon tetrachloride. With the resist pattern of Example 8 a similar precise chromium pattern could be obtained. On the other hand, the resist pattern of Control 2 flowed at the time of post-baking, and the precision of the resultant chromium pattern was inferior. With the resist pattern of Example 8 the etching rate with carbon tetrachloride was about 830 Å/min., thus proving the excellent etching-resisting property of this layer compared to the case of Control 2 (with which the etching rate was about 1,600 Å/min.).

EXAMPLE 9

Polymethacrylate powder was thermally treated at 230° C. for 120 minutes to obtain poly-(methacrylic anhydride), which was dissolved in an N-methylpyrrolidone-dimethylformamide solvent mixture with a mixture ratio of 1:1, and the resultant solution was coated by spin coating on a chromium-masked substrate and then heated at 200° C. for 60 minutes to form a positive resist layer. Then, patterns were drawn on this resist layer and developed in the manner as described in Example 8 to obtain a resist pattern.

The obtained resist pattern was found to be highly precise, having a precision of the order of submicrons.

As has been described in the foregoing, according to the invention it is possible to obtain improvement of the developing selectivity between irradiated and non-irradiated portions and also obtain improvement of the sensitivity with a combination of a novel resist material and a developer therefor. Also, the reduction of the thickness of the non-irradiated portion can be reduced, so that it is possible to prepare resist patterns having high resolution. Further, the resist material according to the invention has excellent thermal stability and is hence capable of satisfactorily withstanding dry etching, so that the resist pattern obtained by the method according to the invention can be used for dry etching. Furthermore, according to the invention fine and highly precise resist patterns can be prepared with extremely low doses of ionizing radiation compared to the prior-art method.

What we claim is:

1. A method of preparing a resist pattern comprising a step of forming a positive resist layer consisting of poly-(methacrylic anyhdride), a step of irradiating said resist layer with a predetermined pattern of ionizing radiation, and a step of developing the irradiated area with a developer comprising a mixture solvent composed of a polar organic solvent (A) capable of dissolving poly-(methacrylic anhydride) and a solvent (B) which is a non-solvent for poly-(methacrylic anyhdride, said solvent (A) being at least one member selected from the group consisting of dimethylformamide, dimethylacetoamide, N-methylpyrrolidone and dimethylsulfoxide, said solvent (B) being at least one member selected from the group consisting of benzene, toluene chlorobenzene, methylisobutylketone, methylethylketone, ethyl acetate, isoamyl acetate, butyl cellosolve acetate and ethyl cellosolve acetate, and the weight ratio of said solvent (A) to said solvent (B) being within a range between 1/4 to 4/1.

2. The method according to claim 1, wherein polymethacrylic acid or polymethacrylate is used as a starting material in said step of forming a positive resist layer consisting of poly-(methacrylic anhydride).

3. The method according to claim 2, wherein said poly-methacrylate is polyalkyl methacrylate having an alkyl group with a carbon atom number of 4 or above.

4. The method according to claim 2 or 3, wherein said step of forming a positive resist layer consists of coating polymethacrylic acid or polymethacrylate on said substrate and thermally treating the coating at 200° to 250° C.

5. The method according to claim 2 or 3, wherein said step of forming a positive resist layer consists of converting polymethacrylic acid or polymethacrylate into poly-(methacrylic anhydride) through thermal treatment at 200° to 250° C. dissolving said poly-(methacrylic anhydride) in said solvent (A) and coating the resultant solution on said substrate.

6. The method according to claim 1, wherein said ionizing radiation is selected from a group consisting of an electron beam, X-rays, γ-rays and α-rays.

7. The method according to claim 1, wherein said non-solvent (B) is at least a member of a group consisting of an aromatic series solvent and a ketone series solvent.

* * * * *